United States Patent [19]

Kravitz et al.

[11] 4,426,246

[45] Jan. 17, 1984

[54] PLASMA PRETREATMENT WITH BCL₃ TO REMOVE PASSIVATION FORMED BY FLUORINE-ETCH

[75] Inventors: Stanley H. Kravitz, Coopersburg; Ajit S. Manocha, Allentown, both of Pa.; William E. Willenbrock, Jr., Manchester Township, Ocean County, N.J.

[73] Assignee: Bell Telephone Laboratories, Incorporated, Murray Hill, N.J.

[21] Appl. No.: 401,830

[22] Filed: Jul. 26, 1982

[51] Int. Cl.³ .......................................... H01L 21/308
[52] U.S. Cl. .................... 156/643; 156/646; 156/657; 156/662; 204/192 E; 252/79.1
[58] Field of Search ............... 156/643, 646, 657, 662; 252/79.1; 204/192 E; 357/59

[56] References Cited

U.S. PATENT DOCUMENTS

| 3,881,971 | 5/1975 | Greer et al. | 156/657 |
|---|---|---|---|
| 3,971,684 | 7/1976 | Muto | 252/79.1 |
| 4,106,051 | 8/1978 | Dormer et al. | 357/59 |
| 4,214,946 | 7/1980 | Forget | 156/646 |
| 4,255,230 | 3/1981 | Zajac | 156/646 |
| 4,256,534 | 3/1981 | Levinstein | 156/657 |
| 4,298,443 | 11/1981 | Maydan | 204/192 |
| 4,310,380 | 1/1982 | Flamm et al. | 252/79.1 |
| 4,383,885 | 5/1983 | Maydan | 156/643 |

FOREIGN PATENT DOCUMENTS 5506407 1/1981 Japan .................................. 156/643

OTHER PUBLICATIONS

Bower, "Planar . . . NF₃" J. of Electrochemical Society vol. 129, No. 4 (4/82) pp. 795–799.
G. C. Schwartz and P. M. Schaible, "Reactive Ion Etching of Silicon", *Journal of Vacuum Science and Technology 16(2)*, Mar./Apr. 1979, p. 410.
W. W. Yao and R. H. Bruce, "Anisotropic Polysilicon Etching with Cl₂ Plasma", *Electrochemical Society Extended Abstracts*, vol. 81-2, Oct. 1981, p. 652.

*Primary Examiner*—Jerome W. Massie
*Attorney, Agent, or Firm*—Lucian C. Canepa

[57] ABSTRACT

The manufacture of VLSI devices is facilitated by a method for chlorine reactive sputter etching of silicon materials in a plasma reactor that has been passivated by a previous etching operation involving a fluorine-containing gas. The passivated reactor is reactivated for chlorine reactive sputter etching by the generation of a boron trichloride plasma in the reactor. In the preferred embodiment, a mixture of boron trichloride and chlorine is used to initiate the etching of the silicon material before pure chlorine is used to complete the etch. The invention permits silicon materials to be etched in a reactor in which chlorine and fluorine-containing gases are used sequentially.

8 Claims, 5 Drawing Figures

PLASMA PRETREATMENT WITH BCL₃ TO REMOVE PASSIVATION FORMED BY FLUORINE-ETCH

BACKGROUND OF THE INVENTION

This invention relates to the manufacture of very small dimensioned devices such as integrated circuits and, more particularly, to high resolution pattern delineation by plasma-assisted etching in the manufacture of such devices.

In the manufacture of integrated circuits and other very small dimensioned devices, lithographic processes are used to transfer a layout by a designer to a corresponding high resolution pattern on a surface above an appropriate substrate. Such processes normally consist of a masking operation in which the pattern is first defined in a masking layer above the surface to be patterned and a subsequent pattern transfer operation in which the pattern in the mask layer is transferred to the inderlying surface. Formerly, the pattern transfer process included wet chemical etching which provides isotropic etching of the surface, i.e., the etch rate is essentially the same in all directions. Currently, so-called very-large-scale-integration (VLSI) devices, such as the 64 kilobit dynamic random access memory (RAM), having device feature dimensions of less than 2 $\mu$m are being developed. The manufacture of such devices requires the use of pattern transfer techniques capable of delineating very fine features. For such fine feature delineation, wet etching techniques have the disadvantage in that the isotropic nature of such etching causes undercutting beneath the masking layer and, consequently, results in poor feature size control.

Recently, there have been developed various plasma-assisted etching techniques which under proper conditions can provide anisotropic etching of a surface, i.e., the etch rate is higher in one direction (usually normal to the surface being etched) than in other directions. Since an anisotropic etch causes less undercutting, it is better suited to high resolution pattern transfer than an isotropic etch. In general, plasma-assisted etching techniques involve the exposure of the surface to be etched to a plasma contained in an apparatus. The plasma is normally generated by the application of an RF electric field across an appropriate gaseous ambient between a pair of electrodes in the apparatus.

One of the plasma-assisted etching techniques called reactive sputter etching is known to provide a particularly high degree of anisotropy, i.e., etching takes place substantially only normal to the surface being etched. Reactive sputter etching is typically performed with the gaseous ambient at a relatively low pressure (e.g., $1 \times 10^{-3}$ to 0.1 Torr) and the device to be etched supported by the electrode which is driven by the source of RF power. Etching takes place through sputtering of the surface being etched with chemically reactive ion species. Since under the low conditions in the plasma the ions impinge on the surface being etched largely at normal incidences and a chemical reaction occurs between the impinging ions and the material of the surface, etching takes place anisotropically and rapidly.

In addition to anisotropy, it is also important for many applications for the etching process to be highly selective. That is, the etch rate of the material being etched must be much higher than that of the masking layer and that of the next underlying layer.

There has been considerable effort recently directed towards developing etching processes for high resolution pattern transfer to surfaces of silicon materials, particularly for the patterning of polycrystalline silicon (polysilicon) layers. The term "silicon materials" refers to materials of predominantly elemental silicon composition. Such materials may be single crystalline, polycrystalline, or amorphous and may be doped or undoped. In the manufacture of VLSI silicon-gate metal-oxide-semiconductor (MOS) devices, such as the 64 kilobit dynamic RAM, polysilicon layers are patterned to form capacitor plates of memory cells, gate electrodes of transistors and circuit interconnections. In such devices, the etching process for patterning the polysilicon layer must be both highly anisotropic to provide accurate feature size control and highly selective with respect to silicon dioxide to avoid removal to a very thin (as thin as 500 Angstroms) layer of silicon dioxide which underlies the polysilicon layer in some regions of the device.

Reactive sputter etching of doped or undoped silicon materials in a pure chlorine ($Cl_2$) plasma is known to provide a high degree of anisotropy, a high etch selectivity with respect to silicon-dioxide and a rapid etch rate. The characteristics of such etching are described, for example, in "Reactive Ion Etching of Silicon" by G. C. Schwartz and P. M. Schaible, *Journal of Vacuum Science and Technology* 16(2) March/April 1979, p. 410 and in "Anisotropic Polysilicon Etching with $Cl_2$ Plasma" by W. W. Yao and R. H. Bruce, *Electrochemical Society Extended Abstracts*, Volume 81-2, October 1981, p. 652. The silicon to silicon-dioxide etch selectivity in reactive sputter etching of silicon materials in a chlorine plasma is enhanced (up to 25:1) if the driven electrode of the etching apparatus is covered with a layer of alumina ($Al_2O_3$). The use of alumina as a protective cover of the driven electrode in plasma-assisted etching apparatus is disclosed and claimed in copending and commonly assigned U.S. patent application Ser. No. 295,531, filed on Aug. 19, 1981.

However, there is a problem in using reactive sputter etching of silicon materials in a chlorine plasma in that such an etching process cannot easily be carried out in an apparatus that has been used in another etching process involving a plasma generated in a fluorine-containing compound such as nitrogen trifluoride or trifluoromethane. For example, in the manufacture of the aforementioned 64 kilobit dynamic RAM, the etching of one of the polysilicon layers used in that device is carried out in two stages. An anisotropic etching stage is first used to define a high resolution pattern in that layer followed by an isotropic etching stage to remove undesired polysilicon filaments left by the anisotropic etch. Owing to the advantages discussed above, it is desirable to use chlorine plasma reactive sputter etching for the anisotropic etching stage. For the isotropic etching stage it is advantageous to use reactive sputter etching in a nitrogen tirfluoride ($NF_3$) plasma which provides a very rapid etch rate and very high etch selectivity (up to 40:1) with respect to silicon dioxide. Plasma-assisted etching of silicon materials in a nitrogen trifluoride plasma is disclosed and claimed in commonly assigned U.S. Pat. No. 4,310,380. It is also desirable in a manufacturing operation to carry out both stages of polysilicon etching in the same etching apparatus in order to achieve a high throughput for the apparatus. However, exposure of the apparatus to the nitrogen trifluoride plasma during the isotropic etching stage causes the apparatus to be passivated for chlorine reactive sputter etching of silicon materials. Such passivation causes chlorine reactive sputter etching of silicon materials to proceed very slowly, if at all, in the apparatus. This passivation problem, which is related to the "black silicon" problem reported in the above-cited reference by G. C. Schwartz et al., has been found to depend on the presence of an inorganic oxide material (e.g., $SiO_2$ or $Al_2O_3$) on the driven electrode of the apparatus and the exposure of such a material to a plasma generated in a fluorine-containing compound (e.g., $NF_3$, $CHF_3$ or $C_2F_6$). The passivation is worsened when the driven electrode is covered with alumina.

Formerly, a passivated apparatus is reactivated by generating a chlorine plasma at a high RF power for a long period (typically 30 minutes) or by washing the apparatus in a 1 M solution of hydrochloric acid. However, neither reactivation procedure is practical in a manufacturing etching operation owing to the long delays involved. Therefore, a need exists for a method which is feasible in a manufacturing operation for carrying out reactive sputter etching of a silicon material in a chlorine plasma with an etching apparatus that has been exposed to a plasma generated in a fluorine-containing compound. Such a method would significantly improve the manufacture of VLSI silicon-gate MOS devices and other devices requiring high resolution pattern transfer onto the surface of a silicon material.

Summary of the Invention

The problems of plasma-assisted etching of silicon materials in the manufacture of VLSI silicon-gate MOS integrated circuits and other devices discussed above are solved by a method in which an etching apparatus which has previously been exposed to a plasma generated in a fluorine-containing compound is reactivated for reactive sputter etching of the silicon material in a chlorine plasma by generating a boron trichloride ($BCl_3$) plasma in the apparatus. The boron trichloride plasma may be generated in the apparatus in a separate pretreatment step after the apparatus has been used with a fluorine-containing compound and before it is used with chlorine. In the alternative, the boron trichloride plasma may be used to initiate etching of the silicon material. In the preferred embodiment of the invention, reactive sputter etching of the silicon material in a passivated apparatus is initially carried out in a plasma generated in a mixture of boron trichloride and chlorine. After the onset of etching, the boron trichloride is shut off, and pure chlorine is used for the anisotropic etching of the silicon material. Where required, this is followed by isotropic reactive sputter etching of the silicon material in a nitrogen trifluoride plasma.

DETAILED DESCRIPTION

Figure 1:
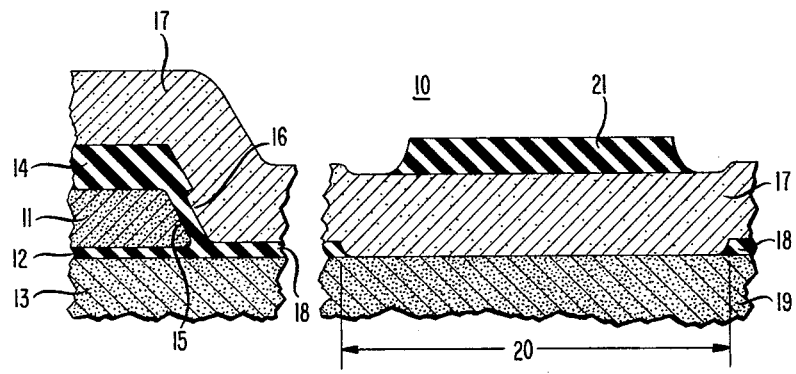
FIGS. 1 through 4 show cross-sectional views of portions of a partially completed exemplary VLSI silicon-gate MOS device illustrating various stages of a plasma-assisted etching operation during the manufacture of the device in accordance with the principles of the present invention.

Referring now to FIGS. 1 thru 4, there are shown cross-sectional views of portions of a partially completed exemplary VLSI silicon-gate MOS device 10 illustrating various stages of an etching operation during its manufacture. The same reference numbers are used throughout FIGS. 1 through 4 to denote like regions and portions of the device. The device is a 64 kilobit dynamic RAM which uses two levels of polysilicon respectively designated POLY I and POLY II. The etching operation being illustrated is for the patterning of the POLY II level. As shown in FIG. 1, the POLY I level 11, which is heavily doped and 4000 Angstroms thick, has been previously patterned to form one plate of a storage capacitor of a dynamic memory cell, the other plate of the capacitor being provided by a p-type region 13 of a single crystalline silicon body separated from layer 11 by a 300 Angstroms thick silicon dioxide layer 12. Etching of the POLY I level was masked by a 2700 Angstroms thick intermediate silicon dioxide layer 14. A silicon dioxide layer 15 was thermally grown on the sidewalls of the POLY I layer after etching. Owing to undercutting of the POLY I level during etching, an oxide step 16 adjacent to the sidewall of the POLY I layer was formed with a re-entrant shape.

Prior to patterning, the POLY II layer 17, which is undoped and 5000 Angstroms thick, covers the intermediate oxide layer 14 and a 500 Angstroms thick silicon dioxide layer 18. In another portion of the device, the POLY II layer contacts a heavily doped n-type region 19 of the silicon body through an aperture 20 in oxide layer 18. A strip-like silicon dioxide layer 21, 2500 Angstroms thick and 2 $\mu$m wide, is formed to serve as a mask for the etching of the POLY II layer to form a bit-line of the memory cell array. In another portion of the device not depicted, the POLY II layer is patterned in the same etching operation to form gate electrodes of transistors and circuit interconnections. Since the dimensions of the bit-lines and the gate electrodes are critical to the performance of the device, it is advantageous to pattern the POLY II layer using an etch which provides a high degree of anisotropy to obtain accurate feature size control.

Figure 2:
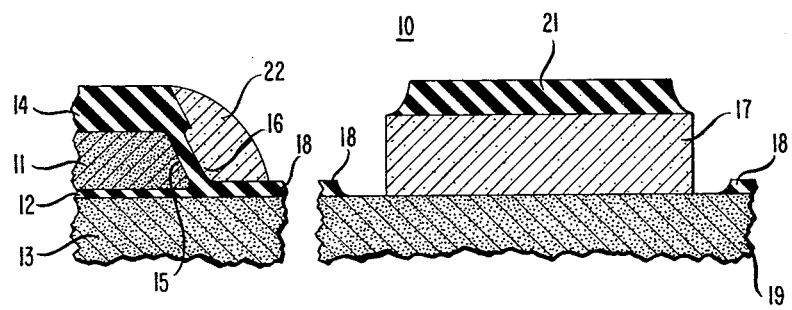

Turning now to FIG. 2, the region 22 of the POLY II layer adjacent to the step 16 is difficult to remove with an anisotropic etching process. To ensure removal of such regions the etching of the POLY II layer must continue long after the surfaces of the silicon dioxide layers 14 and 18 are exposed to the plasma etchant. Since oxide layer 18 is only 500 Angstroms thick, the etching process used for the POLY II layer must have a very high selectivity with respect to silicon dioxide in order to minimize etching of layer 18. For these reasons, it is desirable to use chlorine reactive sputter etching in an apparatus having an alumina covered driven electrode for the anisotropic etching stage of the POLY II layer.

Figure 3:
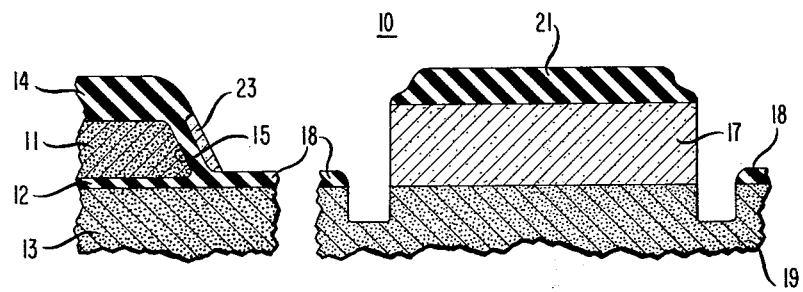

The structure of the device after the anisotropic etching stage is shown in FIG. 3. Owing to the nearly perfect conformal coverage of the re-entrant shaped step 16 by the POLY II layer, the anisotropic etching leaves a polysilicon filament 23 which can cause electrical shorts in the memory cell. Therefore, this filament must be removed by an isotropic etch. Furthermore, the isotropic etch must have a high selectivity with respect to silicon dioxide in order to minimize the etching of oxide layer 18. For these reasons it is desirable to use reactive sputter etching in a nitrogen trifluoride plasma for the isotropic etching of the POLY II layer.

Figure 4:
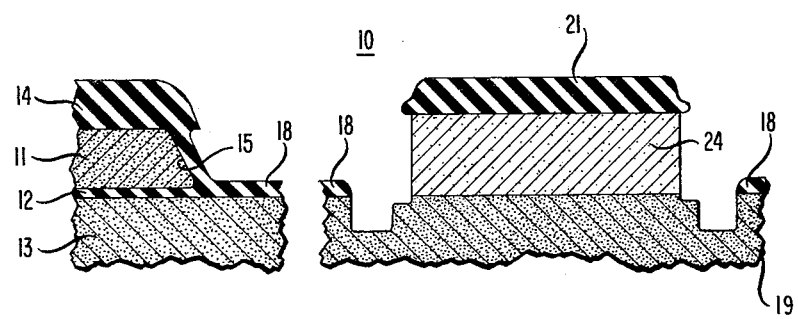

The structure of the device after the isotropic etching stage is shown in FIG. 4. The isotropic etch reduces the total width of the bit-line conductor 24 by approximately 0.5 μm from its nominal width of 2 μm. The final thickness of layer 18 is approximately 300 Angstroms.

In a manufacturing operation, it is desirable to carry out both the isotropic and anisotropic etching of the POLY II layer in the same etching apparatus, and thereby eliminate the delay in transferring the device wafers into another apparatus. However, as indicated above, exposure of an etching apparatus to a nitrogen trifluoride plasma causes a passivation problem which hinders subsequent reactive sputter etching of silicon in a chlorine plasma in the same apparatus, the passivation problem being worsened by the presence of an alumina covered driven electrode.

According to one embodiment of the present invention, the passivation problem is solved by using a plasma generated in boron trichloride to pretreat the apparatus after etching with a fluorine-containing compound and before loading of the device wafers in the apparatus for reactive sputter etching of a silicon material in a chlorine plasma. The pretreatment is advantageously performed at a boron trichloride pressure of $5 \times 10^{-3}$ Torr and a power density (RF power per unit area of driven electrode) of 0.3 watts/cm$^2$ for approximately three minutes. However, in accordance with the present invention, the pretreatment may generally be carried out at a pressure and a power density in the ranges of $5 \times 10^{-3}$ to 0.1 Torr and 0.1 to 0.5 watts/cm$^2$, respectively. The duration of the pretreatment may generally be as short as two minutes.

According to another embodiment of the present invention, reactive sputter etching of a silicon material in a passivated apparatus is at least initially carried out in a boron trichloride plasma. Because the boron trichloride plasma etches the silicon material at a relatively slow rate and with relatively low selectivity, with respect to silicon dioxide, it is advantageous to switch over to a pure chlorine plasma after the onset of etching. The reactive sputter etching of the silicon material in a boron trichloride plasma is advantageously carried out at a pressure of $1 \times 10^{-2}$ Torr and at a power density of 0.3 watts/cm$^2$. However, in accordance with the present invention, such etching may generally be carried out at a pressure and a power density in the ranges of $5 \times 10^{-3}$ to 0.1 Torr and 0.1 to 0.5 watts/cm$^2$, respectively.

According to still another and preferred embodiment of the present invention, reactive sputter etching fo a silicon material in a passivated apparatus is at least initially carried out in a mixture of boron trichloride and chlorine. The use of such a gas mixture provides faster initiation of etch than pure boron trichloride. Since the etch rate and selectivity provided by the mixture are both lower than provided by pure chlorine, it is advantageous to switch over to a pure chlorine plasma after the onset of etching of the silicon-material. The onset of etching is advantageously determined by directly monitoring the etch rate of the silicon material in the apparatus. However, other means of determining the start of etching, such as by observing a color change in the light emitted by the plasma or by waiting a predetermined period of time after the device wafers are exposed to the boron trichloride plasma, may also be used.

Reactive sputter etching of the silicon material in a mixture of boron trichloride and chlorine is advantageously carried out with a mixture having a 75 volume percent chlorine content and at a pressure and a power density of $1.4 \times 10^{-2}$ Torr and 0.3 watts/cm$^2$, respectively. However, in accordance with the present invention, such etching may generally be carried out in a mixture having a chlorine content of up to 98 volume percent and at a pressure and a power density in the ranges of $5 \times 10^{-3}$ to 0.1 Torr and 0.1 to 0.5 watts/cm$^2$, respectively.

In each of the above-described embodiments, the dc voltage developed across the electrodes of the etching apparatus is not generally critical to the effectiveness of the boron trichloride plasma in reactivating the passivated apparatus. The frequency of the RF field is also not generally critical in the reactivation process so long as that frequency is greater than the ion plasma resonance frequency and lower than the electron plasma resonance frequency in the apparatus. The gas flow rates to be used in the described embodiments depend on the volume of the specific etching apparatus used and the exhaust capacity of the vacuum pump system used to evacuate such apparatus. The preferred flow rate for a given apparatus may be readily determined by one of ordinary skill in the art of plasma-assisted etching.

Figure 5:
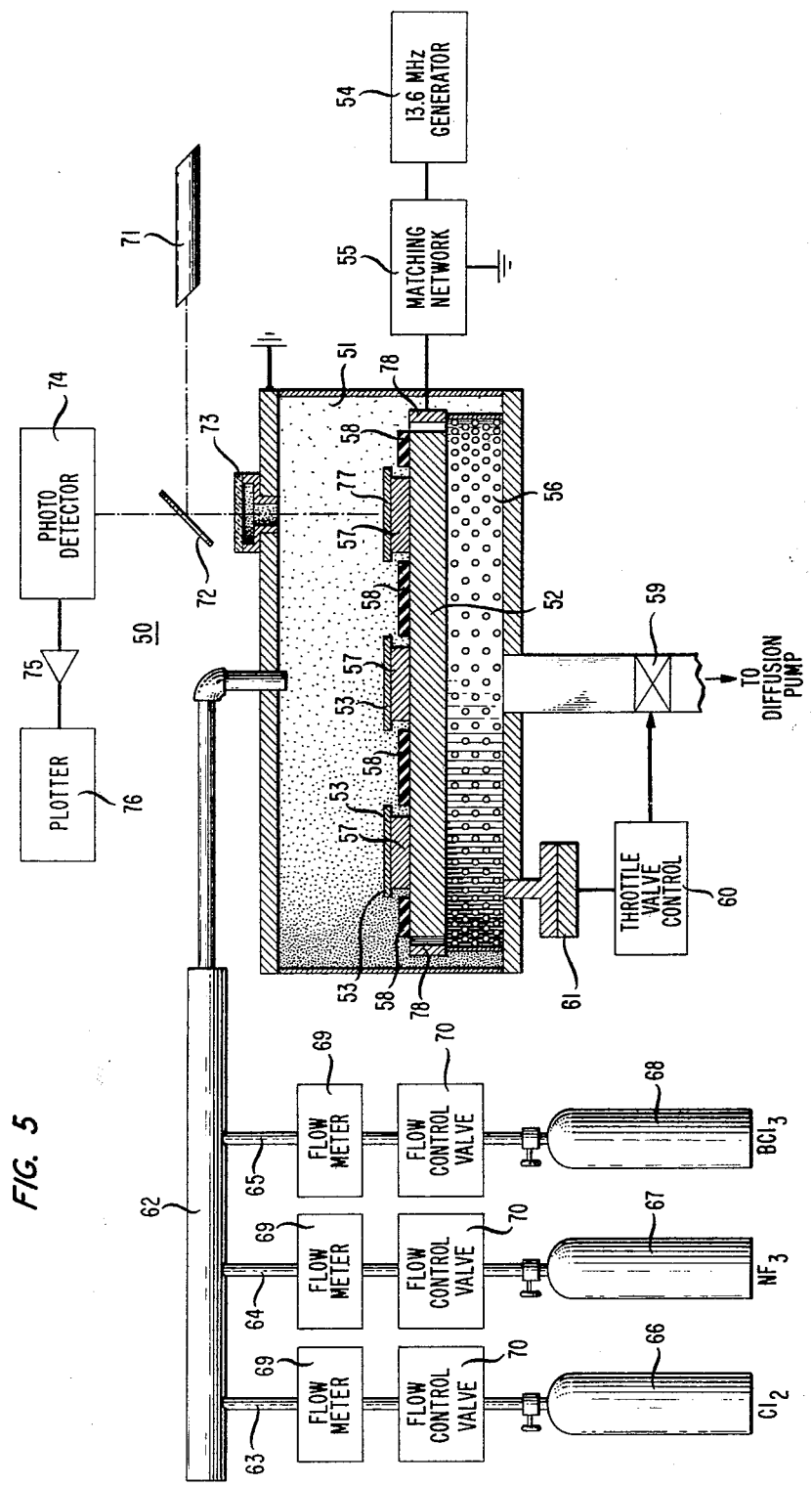
FIG. 5 is a partially schematic depiction of an exemplary plasma-assisted etching apparatus in which the method of the present invention can be performed.

Referring now to FIG. 5, there is shown a partial schematic representation of exemplary plasma-assisted etching apparatus 50 for practicing the subject method of the invention. The apparatus is known as a parallel plate reactor and includes a cylindrical metal-walled vacuum chamber 51 having an inner diameter of approximately 24 inches and an inner height of approximately 7 inches. Inside the chamber and electrically insulated from the chamber walls is a circular water-cooled aluminum electrode 52, approximately 22 inches in diameter. Electrode 52 is driven with RF power from a 13.6 MHz signal generator 54 which is capacitatively coupled to the driven electrode through an impedance matching network 55. The metal walls of the vacuum chamber are grounded and serve as the other electrode for the application of RF electric fields to the etch gas in the chamber.

Available power from the RF generator is in the range of 50 to 2000 watts. At the low gas pressures used for reactive sputter etching, a dc voltage of up to several hundred volts is developed in the plasma discharge between the walls of the chamber and the driven electrode. The polarity of this voltage is such that the driven electrode is biased negative with respect to the chamber walls. In a normal reactive sputter etching operation, the RF power is automatically controlled by the RF signal generator 54 to maintain a desired dc bias voltage.

The driven electrode is surrounded by a coaxial cylindrical metal dark-space shield 78 which is positioned to be in the Crooke's dark-space of a discharge generated in the chamber. A cylindrical perforated metal screen 56 extends from the dark-space shield to the base of the chamber. The dark-space shield and perforated screen are both grounded and serve to prevent discharge from occurring at the sides and bottom of the driven electrode 52.

The device wafers 53 to be etched are supported above the top surface of the driven electrode on cylindrical aluminum pedestals 57. Portions of the top surface of the driven electrode surrounding the pedestals 57 are protected by a cover made of stainless steel coated with alumina. As discussed above, the use of an alumina cover on the driven electrode enhances the silicon to silicon-dioxide etch selectivity in reactive sputter etching in a chlorine plasma.

The vacuum chamber communicates with a pumping system comprising a 6 inch diameter oil diffusion pump backed by a mechanical pump having a capacity of 30 cubic feet per minute. The chamber is pumped to a pressure of approximately $5 \times 10^{-5}$ Torr before the etch gases are admitted at the top of the chamber. Pressure in the chamber is automatically regulated by an electrically operated venetian-blind throttle valve 59 controlled by a throttle valve control unit 60 which senses the chamber pressure through a Baratron vacuum gauge 61. The etch gases are provided to the chamber through a gas handling system comprising a manifold 62 having branches 63 to 65 connected to gas bottles 66 to 68, respectively. The gas bottles 66 to 68 contain chlorine, nitrogen, fluoride and boron trichloride, respectively. Each of the manifold branches includes a flow meter 69 and an electronic flow control valve 70 for automatically regulating the flow rate of each etch gas.

The etch rate in the chamber is directly monitored by a laser interferometer system comprising a helium-neon laser 71, a beam splitter 72, a photodetector 74, an amplifier 75 and a plotter 76. The laser provides a collimated beam of 6328 Angstroms coherent light. The beam splitter directs a portion of the light beam through a window 73 in the top chamber wall onto the surface of a control wafer 77 having a layer of the material being etched. The reflected light from the control wafer is received by the photodetector, the output of which is amplified and provided to the plotter. The plotter provides plots of the intensity of the reflected light versus time. Owing to the interference of light reflected from the upper and lower surfaces of the layer on the control wafer, the plot of reflected light intensity versus time exhibits interference fringes from which the etch rate of the layer may be accurately determined. In accordance with the present invention, the laser interferometer system is advantageously used to monitor the onset of etching of a silicon material in a boron trichloride containing plasma in a passivated apparatus.

The following are the preferred conditions for carrying out reactive sputter etching of the POLY II layer in the above-described exemplary device using the exemplary parallel plate reactor apparatus and the preferred embodiment of the present invention. For the anisotropic etching stage the etch gas in the reactor is initially a mixture of boron trichloride and chlorine at a pressure of $1.4 \times 10^{-2}$ Torr. The flow rates of the boron trichloride and chlorine are 12 and 48 SCCM, respectively. The RF power is controlled to maintain a dc bias of 275 V across the electrodes. The etch rate is monitored with the laser interferometer system to determine the onset of etching, which occurs in approximately four minutes. At the onset of etching, the etch rate is approximately 500 Angstroms per minute and the polysilicon to silicondioxide etch selectively is approximately 10:1. After the onset of etching the boron trichloride is shut off and etching continues in pure chlorine. The pressure, flow rate and dc bias are maintained at $1.4 \times 10^{-2}$ Torr, 48 SCCM, and 275 V, respectively. Etching in the chlorine plasma is carried out until 10,000 Angstroms of polysilicon is removed, as measured by the laser interferometer system on the control wafer which is covered by a uniform 12,000 Angstroms layer of identical polysilicon material. The polysilicon etch rate and the polysilicon to silicondioxide etch selectivity in the chlorine plasma are approximately 750 Angstroms per minute and 25:1, respectively.

For the isotropic etching stage, the etch gas in the reactor is substantially pure nitrogen trifluoride. The pressure, flow rate and dc bias are maintained at $2.8 \times 10^{-2}$ Torr, 55 SCCM and 10 V. respectively. Etching in the nitrogen trifluoride plasma is carried out until 2000 Angstroms of polysilicon is removed, as measured by the laser interferometer system on the control wafer. The polysilicon etch rate and the polysilicon to silicondioxide etch selectivity are approximately 2000 Angstroms per minute and 40:1, respectively.

While this invention as been described in terms of a particular two stage plasma-assisted etching operation carried out in a specific etching apparatus in the manufacture of a specific type of device, it will be understood by those skilled in the art that various changes in the details of the operation, the apparatus and device may be made without departing from the spirit and scope of the invention. For example, the operation may involve the etching of a silicon material in an apparatus passivated by exposure to a plasma generated in a fluorine-containing compound during the etching of a nonsilicon material. Other types of etching apparatus may be used to practice the invention, such as the multifaceted plasma reactor disclosed in commonly assigned U.S. Pat. No. 4,298,443.

What is claimed is:

1. A method for manufacturing a device comprising at least one operation in which a layer of the device being manufactured is to be etched, wherein the device is etched in the presence of a plasma contained within an apparatus, the plasma being generated in a gaseous ambient by the application of an electric field across a portion of the gaseous ambient between two electrodes, one of the electrodes supporting the device to be etched, the layer to be etched comprising silicon masked by a pattern of relatively etch-resistant material, the step of etching the layer being performed in a gaseous ambient comprising substantially pure chlorine, the apparatus having been used in a previous etching step in which the gaseous ambient comprised a fluorine-containing compound, characterized in that following the previous etching step, a plasma is generated in the apparatus in a gaseous ambient comprising boron trichloride.

2. A method for manufacturing a device comprising at least one operation in which a surface of the device being manufactured is to be etched, wherein the device is etched in the presence of a plasma contained within an apparatus, the plasma being generated in a gaseous ambient by the application of an electric field across a portion of the gaseous ambient between two electrodes, one of the electrodes supporting the device to be etched, the surface to be etched being a silicon material, the etching of the surface to be performed in a gaseous ambient comprising chlorine, the apparatus having been used in a previous etching operation in which the gaseous ambient comprises a fluorine-containing compound, characterized in that following the previous etching operation a plasma is generated in the apparatus in a gaseous ambient comprising boron trichloride, and further characterized in that after the previous etching operation and prior to loading of the device to be etched in the apparatus, a plasma is generated within the apparatus in a gaseous ambient comprising substantially pure boron tirchloride at a pressure in the range of $5\times10^{-3}$ Torr to 0.1 Torr, the plasma having a power density in the range of 0.1 watts/cm$^2$ to 0.5 watts/cm$^2$ and maintained for at least two minutes.

3. A method as recited in claim 1 further characterized in that
the device is at least initially etched in the presence of a plasma generated in a gaseous ambient comprising boron trichloride.

4. A method as recited in claim 3 further characterized in that
the device is at least initially etched in the presence of a plasma generated in a gaseous ambient comprising a mixture of boron trichloride and chlorine in which the chlorine content is in the range of 0 volume percent to 98 volume percent, the mixture being at a pressure in the range of $5\times10^{-3}$ Torr to 0.1 Torr and the plasma generated in the mixture having a power density in the range of 0.1 watts/cm$^2$ to 0.5 watts/cm$^2$.

5. A method as recited in claim 4 further characterized in that
the electrode supporting the device to be etched is at least partially covered with a layer of alumina,
the initial etching of the device is followed by etching of the layer in the presence of a plasma generated in a gaseous ambient comprising substantially pure chlorine at a pressure in the range of $5\times10^{-3}$ Torr to $5\times10^{-2}$ Torr, the plasma generated in the substantially pure chlorine having a power density in the range of 0.1 watts/cm$^2$ to 0.5 watts/cm$^2$.

6. A method as recited in claim 5 wherein the layer to be etched comprises a layer of polycrystalline silicon conformally covering a surface of a layer of silicon dioxide having one or more re-entrant shaped steps, further
characterized in that
the etching of the layer in the presence of a plasma generated in substantially pure chlorine is followed by further etching of the device in the presence of a plasma generated in a gaseous ambient comprising a fluorine-containing compound.

7. A method as recited in claim 6 further characterized in that
the fluorine-containing compound comprises nitrogen trifluoride at a pressure in the range of $1.5\times10^{-2}$ Torr to 0.1 Torr and the plasma generated therein has a power density in the range of 0.04 watts/cm$^2$ to 0.2 watts/cm$^2$.

8. A method for manufacturing a device comprising at least one operation in which a silicon layer of the device is to be etched, the silicon layer being masked by a pattern of silicon dioxide, wherein the device is etched in the presence of a plasma contained within an apparatus, the plasma being generated in a gaseous ambient by the application of an electric field across a portion of the gaseous ambient between two electrodes, one of the electrodes supporting the device to be etched, the apparatus having been used in a previous etching step in which the gaseous ambient comprised a fluorine-containing compound,
characterized in that
following the previous etching step, a plasma is generated in the apparatus in a gaseous ambient comprising boron trichloride, and wherein subsequently the masked silicon layer is etched in the presence of a plasma generated in a gaseous ambient comprising substantially pure chlorine.

* * * * *